United States Patent [19]

Miyajima et al.

[11] Patent Number: 5,256,969

[45] Date of Patent: Oct. 26, 1993

[54] GRADIENT MAGNETIC FIELD COIL FOR MAGNETIC RESONANCE IMAGING SYSTEM

[75] Inventors: Goh Miyajima; Yoshiki Igarashi, both of Katsuta, Japan

[73] Assignee: Hitachi, Ltd., Tokyo, Japan

[21] Appl. No.: 620,612

[22] Filed: Dec. 3, 1990

[30] Foreign Application Priority Data

Dec. 4, 1989 [JP] Japan .................. 1-314596

[51] Int. Cl.$^5$ ............................................ G01R 33/20
[52] U.S. Cl. ....................................... 324/318; 324/300
[58] Field of Search ............... 324/322, 318, 300, 309, 324/320

[56] References Cited

U.S. PATENT DOCUMENTS

| | | | |
|---|---|---|---|
| 3,622,869 | 11/1971 | Golay | 324/320 |
| 4,290,570 | 9/1981 | Smolik et al. | 410/120 |
| 4,300,655 | 11/1981 | Sakamoto et al. | 181/167 |
| 4,324,487 | 5/1982 | Nishihama | 355/73 |
| 4,449,111 | 5/1984 | Nakajima | 336/206 |
| 4,494,349 | 1/1985 | Clements | 52/309.12 |
| 4,639,672 | 1/1987 | Beaumont | 324/318 |
| 4,774,486 | 9/1988 | Moritsu | 324/318 |
| 4,954,781 | 9/1990 | Hirata | 324/318 |
| 5,039,367 | 8/1991 | Sharp | 73/49.2 T |
| 5,084,676 | 1/1992 | Saho | 324/318 |

FOREIGN PATENT DOCUMENTS 59-216045 12/1984 Japan .
61-279238 6/1985 Japan .

OTHER PUBLICATIONS

Noise/Vibration Prevention Handbook (pp. 319-321).

Primary Examiner—Michael J. Tokar
Assistant Examiner—Raymond Y. Mah
Attorney, Agent, or Firm—Antonelli, Terry, Stout & Kraus

[57] ABSTRACT

There is disclosed a gradient magnetic field coil for use in a magnetic resonance imaging system for imaging an imaginary or virtual cross-section of a desired portion of a subject to be inspected, utilizing a magnetic resonance phenomenon. The gradient magnetic field coil includes a coil bobbin and coil windings fixedly mounted on the coil bobbin. The coil bobbin includes a tubular body portion of a honeycomb construction having a number of vacancies formed in a wall of the tubular body portion, a sheet-like outer peripheral portion of a constrained damping structure fixedly secured to an outer peripheral surface of the body portion to reinforce the body portion, and a sheet-like inner peripheral portion fixedly having at least one layer and secured to an inner peripheral surface of the body portion to reinforce the body portion. The generation and continuation of vibrations in the coil bobbin are controlled or suppressed directly by the coil bobbin itself, thereby minimizing the generation of noise.

15 Claims, 7 Drawing Sheets

F I G. 6
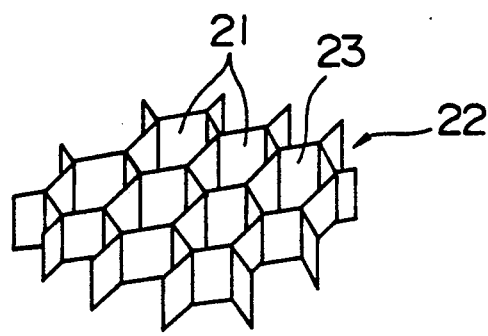
F I G. 7
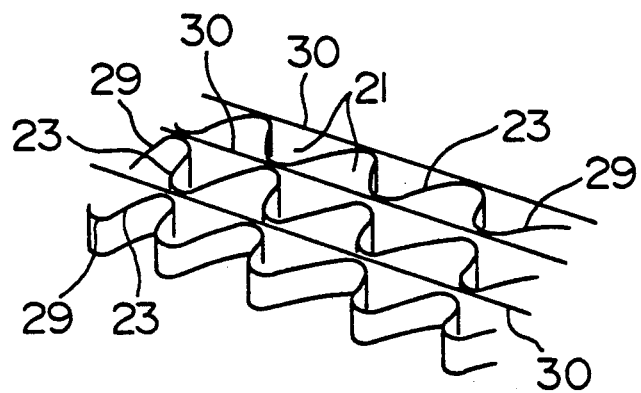

GRADIENT MAGNETIC FIELD COIL FOR MAGNETIC RESONANCE IMAGING SYSTEM

BACKGROUND OF THE INVENTION

This invention relates generally to a magnetic resonance imaging system (typically, nuclear magnetic resonance imaging system) for imaging a desired virtual cross-section of a desired portion of a subject to be inspected, utilizing a magnetic resonance phenomenon, and more particularly to a gradient magnetic field coil for use in such a magnetic resonance imaging system, the gradient magnetic field coil including a coil bobbin and coil windings fixed to the coil bobbin.

A known magnet portion 106 of a magnetic resonance imaging system as shown in FIG. 10 comprises a main magnetic field coil winding 101 for producing a Z-direction or Z-coordinate component of static magnetic field which generally constitutes a super conducting magnet (SCM), a cylindrical coil bobbin 102 arranged inwardly of the main magnetic field coil winding 101, and X-, Y- and Z-direction gradient magnetic field coil windings 103, 104 and 105 which are fixedly mounted on the coil bobbin 102 and modify the intensity of the Z-direction magnetic field along the X-, Y- and Z-directions, respectively, by producing a so-called gradient magnetic field. In the magnetic resonance imaging system, the dependence of the intensity of the magnetic fields (which are produced by the coil windings 101, 103, 104 and 105) on the position, that is, the dependence on the portion (position) of a subject to be inspected 107, is varied so as to vary that portion of the subject 107 from which a magnetic resonance signal is generated, thereby imaging an imaginary cross-section of any desired portion of the subject 107, for example, in view of a distribution of density of a specific isotope. At this time rectangular current pulses are applied to any one of the gradient magnetic field coil windings 103, 104 and 105 (hereinafter designated by 108 when they are collectively referred to), so that due to this pulse current, an electromechanical force of about oHe to several kHz is applied to that gradient magnetic field coil winding. As a result, particularly, the X- and Y-direction gradient magnetic field coil windings 108 which can not be securely fixed sufficiently to the coil bobbin 102 tend to vibrate to strike the coil bobbin 102, thus producing a large noise. For example, when the static magnetic field Ho produced by the main winding 101, the diameter of the coil bobbin 102 and the magnetic field gradient $H_{GC}$ were 0.5 tesla, 700 mm and 0.3 Gauss, respectively, the level of the noise at a position spaced 1 m from the magnet portion 106 is approximately 70 phon when noise reduction measure is not provided. With increase of the static magnetic field Ho and the magnetic field gradient $H_{GC}$, the noise level increases abruptly, and when the static magnetic field Ho is 1.5 tesla, the noise level exceeds 100 phon.

It is known to interpose rubber between the gradient magnetic field coil windings 108 and the coil bobbin 102 in order to suppress the noise due to the above vibration (Such rubber is designated by a reference numeral 13 in FIGS. 1 to 4 of Japanese Patent Unexamined Publication No. 61-279238).

In the above Japanese Patent Unexamined Publication No. 61-279238, it is also proposed to fixedly mount a weight (designated by a reference numeral 14 in FIGS. 3 and 4 of this prior Japanese patent application) on the outer periphery of the coil windings 108 in order to reduce the proper or eigen frequency of the coil windings 108.

However, in the gradient magnetic field coil 109 having the coil bobbin 102 and the gradient magnetic field coil windings 103, 104 and 105, the provision of the rubber can hardly suppress the generation of the noise although the rubber is provided with an intension to suppress the transmission of the vibration from the coil windings 108 to the coil bobbin 102. Therefore, the subject 107 is annoyed with the noise.

On the other hand, the applicants have recognized that the provision of the rubber is not sufficiently effective because the generation of the noise is mainly due to a resonant vibration of the coil bobbin, and have come to the conclusion that it is necessary to suppress the vibration of the coil bobbin in such a manner as to rapidly attenuate the vibration, rather than to suppress the striking against the coil bobbin, because such striking is unavoidable to a certain degree.

It is known, for example, from NOISE/VIBRATION PREVENTION HANDBOOK (pages 319 to 321) published by Hankuhodo that when a partition wall 110 as shown in FIG. 11A is of a hollow structure having an air layer 113 between opposed side walls 111 and 112, a sound insulating effect against the sound propagating in a direction D can be obtained, and that when a partition wall 115 as shown in FIG. 11B has a collectively porous sound absorption material 114 (e.g. a mass of glass wool) filled in the hollow portion 113, the sound insulating effect is enhanced particularly in the range of frequencies of above 200 Hz. In these cases, each of the side walls 111 and 112 is composed of a flexible board 117 and a melamine resin plate 116 bonded thereto. The above HANDBOOK describes a graph indicating the dependence of the transmission loss on the frequency, this graph being shown in FIG. 12. However, the above HANDBOOK merely refers to general sound-insulating characteristics of the partition wall thus formed.

It is also known, for example, in a commercially available "vibration suppression steel plate" that when a thin plate-like body is of a so-called constrained damping structure having a viscoelastic layer between two parallel plates, vibration caused by an impact applied to one of the two parallel plates of this plate-like body can be rapidly attenuated.

SUMMARY OF THE INVENTION

With the above problems in view, it is an object of this invention to provide a gradient magnetic field coil for a magnetic resonance imaging system in which the generation and continuation of vibration of a coil bobbin can be suppressed directly by the coil bobbin itself, thereby minimizing the generation of the large noise.

The above object of the present invention can be achieved by a gradient magnetic field coil comprising:

(a) a coil bobbin including (i) a tubular body portion having a number of vacancies or openings in a wall of the tubular body portion; (ii) a sheet-like or plate-like outer peripheral portion having at least one layer and fixedly secured to an outer peripheral surface of the body portion to reinforce the body portion; and (iii) a sheet-like or plate-like inner peripheral portion having at least one layer and fixedly secured to an inner peripheral surface of the body portion to reinforce the body portion; and (b) coil windings fixedly mounted on the coil bobbin for producing an intermittent or periodic gradient magnetic field.

In the gradient magnetic field coil of the present invention, since the coil bobbin includes the tubular body portion having a number of vacancies in the peripheral wall of the tubular body portion, vibrations of the coil bobbin are dissipated o rapidly attenuated via the vacancies, and therefore the generation of noise can be reduced by suppressing the generation and continuation of vibration in the coil bobbin directly by the coil bobbin itself. The presence of the vacancies serves for reducing as weight of the coil bobbin.

Preferably, each of the vacancies which may preferably be through-holes in the body portion has a triangular shape or a polygonal shape. Such polybonal shape is preferably a hexagonal shape, so that the body portion has a so-called honeycomb structure. In this case, not only the vacancies such as through-holes can suppress the generation and continuation of vibration and noise due to the striking of the coil winding against the coil bobbin, but also the wall portions or lattice portions of the body portion constituting the honeycomb construction cooperate with the sheet-like outer and inner peripheral portions to increase the mechanical strength of the body portion. When the vacancies such as through-hole has a polybonal shape other than a hexagonal shape, or a triangular shape, similar advantageous effects as achieved by the hexagonal through hole can also be obtained. The wall or lattice portions of the body portion separating the vacancies such as through-holes from one another may be corrugated.

Preferably, the body portion of the coil bobbin is made of at least one material selected from the group consisting essentially of non-magnetic metal, fiber-reinforced plastics, engineering plastics, a liquid crystal polymer, ceramics and paper, the fiber of the fiber-reinforced plastics being a material selected from the group consisting essentially of a glass fiber, a carbon fiber and an aramid fiber. A typical example of such non-magnetic metal is non-magnetic stainless steel. The ceramics includes cement.

According to a preferred embodiment of the invention, an appropriate sound absorption material is filled in each of the vacancies such as the through-holes in the body portion. With this arrangement, the generation and continuation of noise at the body portion of the coil bobbin can further be suppressed. Such sound absorption material may, for example, be glass wool or carbon fibers.

According to a preferred embodiment of the invention, each of the outer peripheral portion and the inner peripheral portion is fixedly secured to the body portion by an adhesive. With this arrangement, the outer peripheral portion as well as the inner peripheral portion is fixed to the body portion of the coil bobbin over the entire area thereof, and therefore the generation and continuation of vibration and noise can be suppressed over the entire area of the gradient magnetic field coil.

Preferably, at least one of the outer peripheral portion and the inner peripheral portion is made of at least one material selected from the group consisting essentially of non-magnetic metal, fiber-reinforced plastics, engineering plastics, a liquid crystal polymer, ceramics and paper, the fibers of the fiber-reinforced plastics being made of a material selected from the group consisting essentially of an aramid fiber, an aluminum fiber, a glass fiber, an alumina silica fiber, a carbon fiber, a potassium titanate whisker and a zinc oxide whisker. A typical example of such non-magnetic metal is non-magnetic stainless steel. The ceramics may be cement.

According to a preferred embodiment of the invention, at least one of the outer peripheral portion and the inner peripheral portion comprises a non-magnetic sheet which is made of stainless steel and has a thickness of not more than 1.0 mm.

According to a preferred embodiment of the invention, the outer peripheral portion and the inner peripheral portion are made of different materials from each other. Therefore, the gradient magnetic field coil can have sound-damping and mechanical strength characteristics which can not be expected by the use of a single material.

Preferably at least one of the outer peripheral portion and the inner peripheral portion has a constrained damping structure. Therefore, the suppressing of the vibration is achieved not only at the body portion of the coil bobbin but also at the at least one of the outer and inner peripheral portions, so that the generation of noise from the gradient magnetic field coil ca be suppressed more effectively. In this case, preferably, the constrained damping structure comprises at least two layers of sheets, and a viscoelastic film interposed between the adjacent two layers. With this constrained damping structure, the vibration, due to the striking of the coil winding of one sheet-like member can be significantly attenuated by the viscoelastic film during the time when this vibration is transmitted from the one sheet-like member to the other or adjacent sheet-like member through the viscoelastic film.

According to a preferred embodiment of the invention, at least one of the outer peripheral portion and the inner peripheral portion includes at least one layer of a discontinuous non-magnetic metal sheet. Therefore, not only the generation of eddy current at said at least one of the outer and inner peripheral portions is suppressed, but also the proper vibration of the coil bobbin associated with a standing wave is suppressed, thereby suppressing the generation and continuation of noise.

According to a preferred embodiment of the invention, a ring of non-magnetic metal is mounted on at least one end of the coil bobbin to reinforce the coil bobbin.

The foregoing and other objects, features as well as advantages of the invention will be made clearer from the description of preferred embodiments with reference to attached drawings hereinafter.

BRIEF DESCRIPTION OF THE DRAWINGS

FIG. 6 is a perspective view of a portion of the body portion of the coil bobbin of FIG. 5 as indicated by VI of FIG. 4;

FIG. 7 is a view similar to FIG. 6, but showing a modified coil bobbin body;

DETAILED DESCRIPTION OF THE PREFERRED EMBODIMENTS

One preferred embodiment of the invention will now be described with reference to the drawings.

Figure 1:
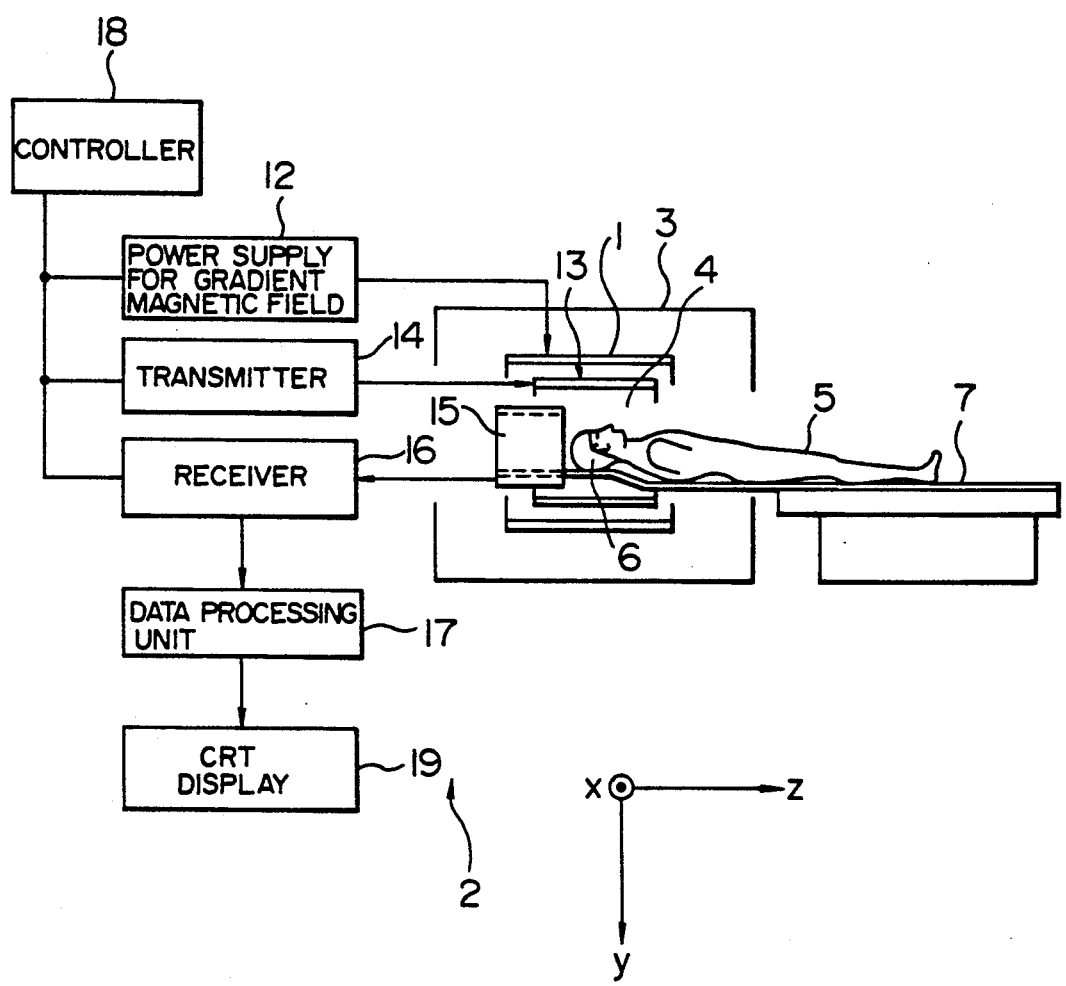
FIG. 1 is a schematic view of a magnetic resonance imaging system incorporating a gradient magnetic field coil according to a preferred embodiment of the invention.
Figure 2:
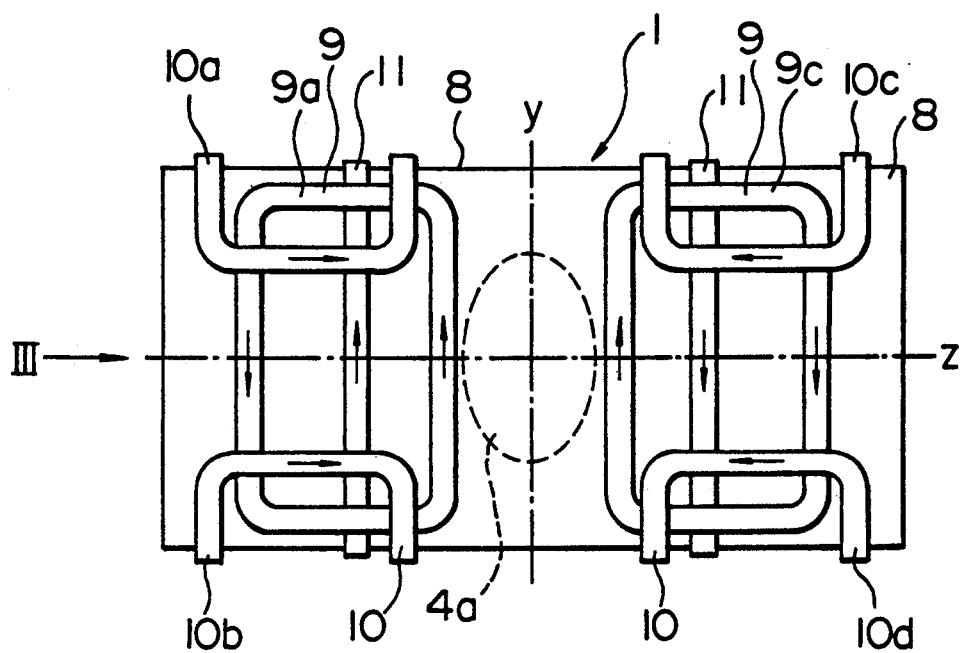
FIG. 2 is a front-elevational view of the gradient magnetic field coil of FIG. 1.
Figure 3:
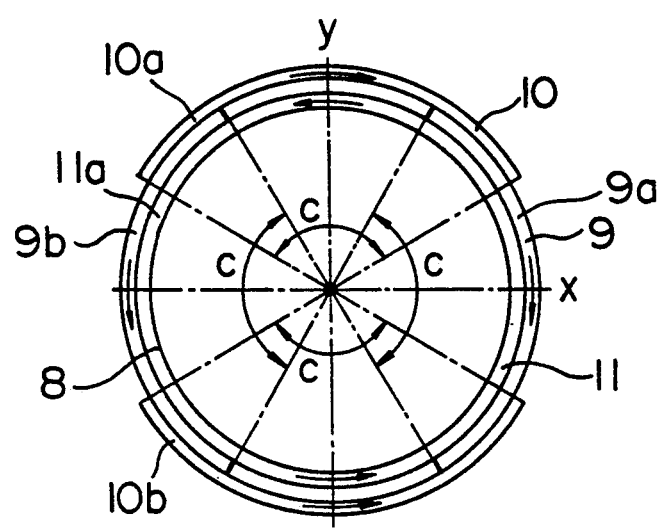
FIG. 3 is a view of the coil of FIG. 2 as seen along an arrow III of FIG. 2.

FIG. 1 shows a magnetic resonance imaging system 2 incorporating a gradient magnetic field coil 1 according to a preferred embodiment of the invention, and FIGS. 2 and 3 schematically show the structure of the gradient magnetic field coil 1. A main magnet 3 such as the SCM has a main winding, and the main magnet 3 is energized or excited by a power source (not shown) so as to produce a main static magnetic field Ho in a Z-direction in an internal space 4. A subject or person to be inspected 5 is laid on a bed 7 in such a manner that his head 6 (i.e., an object to be checked) is disposed in a predetermined central region 4a of the internal space 4. In addition to the static magnetic field Ho, so-called gradient magnetic fields Hox, Hoy and Hoz are produced at the predetermined region 4a of the internal space 4 by the gradient magnetic field coil 1, the intensity of the magnetic field in the Z-direction of the gradient magnetic fields Hox, Hoy and Hoz changes monotonically along X-, Y- and Z-directions, respectively. As shown in FIGS. 2 and 3, the gradient magnetic field coil 1 comprises a coil bobbin 8, two pairs of saddle-shaped X-direction gradient magnetic field windings 9a, 9b, 9c and 9d (collectively designated by a reference numeral 9) each fixedly secured to the coil bobbin 8 and extending over an angle C of 120°, two pairs of saddle-shaped Y-direction gradient magnetic field windings 10a, 10b, 10c and 10d (collectively designated by a reference numeral 10) each fixedly secured to the coil bobbin 8 and extending at an angle C of 120°, and a pair of annular Z-direction gradient magnetic field windings 11a and 11b (collectively designated by a reference numeral 11). A power source 12 for the gradient magnetic field coil supplies rectangular pulse current (which, for example, increases from 0 amp. to 20-100 amp. during a rise time of 1 ms. (milisecond) and is kept at this increased level for several ms, and then decreases from 20-100 amp. to 0 amp. during a fall time of 1 ms.) to the X-direction gradient magnetic field windings 9, the Y-direction gradient magnetic field windings 10 and the Z-direction gradient magnetic field windings 11 at different timings at predetermined repetitive frequencies. Although the sense of directions of flow of the current through the X-, Y- and Z-direction gradient magnetic field windings 9, 10 and 11 are shown in FIGS. 2 and 3, this does not necessarily indicate that the pulse currents should flow through these windings at the same time.

A transmitter or irradiation coil 13 irradiates high-frequency electromagnetic wave pulses A, in response to high frequency current pulses from a transmitter 14, to the head 6 of the subject 5. The intensity of the magnetic field, defined by a sum of the static magnetic field Ho and one of the X-, Y- and Z-direction gradient magnetic fields Hox, Hoy and Hoz, which are exerted on the head 6 during application of each of the high-frequency pulses A, is such that this magnetic field intensity causes a nuclear magnetic resonance at a certain portion, i.e. a virtual cross-section, of the head 6 at the frequency of the high-frequency electromagnetic wave of the pulse A, and a signal B due to the nuclear magnetic resonance is emitted from that certain portion of the head 6. A receiver coil 15 detects the nuclear magnetic resonance signal B. The signal B thus detected by the receiver coil 15 is amplified and detected by a receiver 16, and then is fed to a data processing unit 17. The timings and sequence of the operations of the gradient magnetic field-generating power source 12, the transmitter 14 and the receiver 16 are controlled by a controller 18. The resonance signals B, fed from the various portions of the head 6 in accordance with the magnetic field pulse by the gradient magnetic field coil and the high-frequency pulse A, are converted by the receiver 16, and then are collected in the data processing unit 17. These data are processed in the data processing unit 17 to re-build or form an image, and then the inspection image of the head 6 is displayed in a CRT display 19.

The structure of the coil bobbin 8 which is a material part of the gradient magnetic field coil 1 according to an embodiment of the present invention will now be described in detail with reference to FIGS. 4 to 6.

Figure 4:
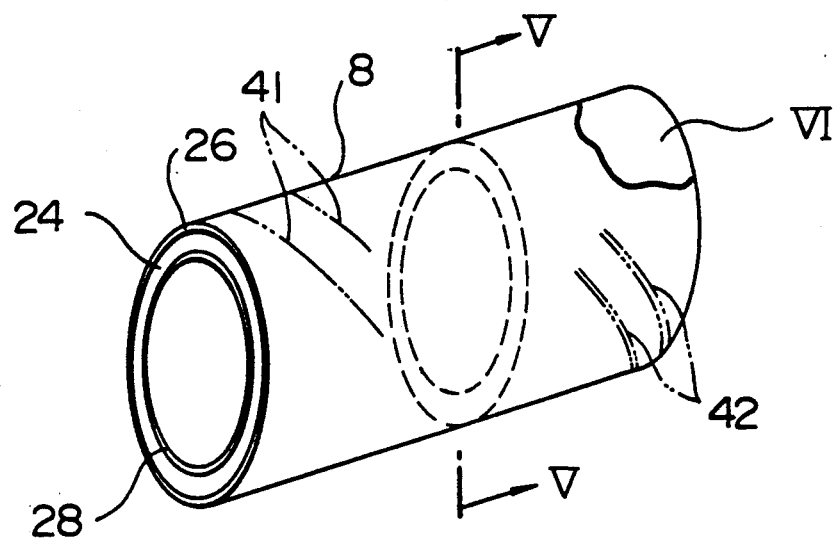
FIG. 4 is a perspective view of a coil bobbin of the gradient magnetic field coil of FIG. 1.

As shown in FIG. 4, the coil bobbin 8 has a hollow cylindrical shape as a whole. The coil bobbin 8 may have a tubular shape of a regular polybonal cross-section instead of the circular cross-section. The coil bobbin 8 comprises a cylindrical body portion 24 of a honeycomb structure 22 having a number of through-holes 21, for providing vacancies or openings, separated by a peripheral wall 23, a sheet-like or plate-like outer peripheral portion 26 fixedly secured to an outer peripheral surface 25 of the body portion 24 so as to reinforce the body portion 24, and a sheet-like or plate-like inner peripheral portion 28 fixedly secured to an inner peripheral surface 27 of the body portion 24 so as to reinforce the body portion 24. Part of vibration of the sheet-like outer peripheral portion 26 caused by the striking of the X- or Y-direction gradient magnetic field windings 9 or 10 against the coil bobbin 8 is transmitted to the wall portion or lattice portion 23 separating the through-holes 21 from one another, and the remainder of this vibration is transmitted to the spaces in the through-holes 21 and is considerably attenuated before it is transmitted to the wall or lattice portion 23 or to the sheet-like inner peripheral portion 28.

The body portion 24 may be made of a non-magnetic material having a certain degree of mechanical strength. More specifically, the body portion 24 having the through holes 21 should have a certain degree of mechanical strength, and should not be unduly heavy in weight, and should not be unduly bulky. For these reasons, preferably, the body portion 24 is made of at least one material selected from the group consisting essentially of non-magnetic metal, fiber-reinforced plastics, engineering plastics, a liquid crystal polymer, ceramics and paper. Preferably, the fiber of the fiber reinforced plastic is a material selected from the group consisting of a glass fiber, a carbon fiber and an aramid fiber.

The through-holes 21 for the vacancies in the body portion 24 are provided for suppressing the transmission of noises (vibrations) through the body portion 24. Therefore, the shape of the through-hole 21 is not limited to a hexagonal shape, and it may have a triangular shape, a square shape, or any other suitable polygonal shape. Such a triangular shape may or may not a regular one, and such a polybonal shape may be or may not be a regular one. Further, the through-hole 21 may have a circular shape, an elliptical or oval shape, or any other suitable shape. In this case, for example, the wall or lattice portion 23 separating the through-holes 21 from one another may be constituted by corrugated sections 29 and generally-straight or differently current corrugated sections 30, as shown in FIG. 7. All or some of the through-holes 21 may have the different shapes. In order to increase the mechanical strength of the wall or lattice portion 23, defining the through-holes 21 of a triangular shape or a polygonal shape, as much as possible, it is preferred that the body portion 24 has a special structure such as the illustrated honeycomb structure 22 having the hexagonal through-holes 21. The size, number and distribution density of the through-holes 21 are determined in view of the mechanical strength of the body portion 24, depending on the kind of material to be used. From the viewpoint of the mechanical strength, it is preferred that the through-holes 21 extend radially of the body portion 24; however, in some cases, the axes of part of the through-holes 21 may be inclined with respect to the radial direction of the body portion 24. Preferably, in so far as the lattice portion 23 defining the through holes 21 have the required mechanical strength it is preferred that the lattice portion 23 is configured such that the lattice portion 23 suppress the direct transmission of vibration therethrough from the outer peripheral portion 26 to the inner peripheral portion 28, and also serves to attenuate the vibration in the through-holes 21.

The vacancies in the body portion 24 need not penetrate through the body portion 24, i.e. need not be opened at both outer and inner circumferential surfaces 25, 27 thereof, but may be spaces not opened to at least one of the surfaces 25, 27.

Figure 5:
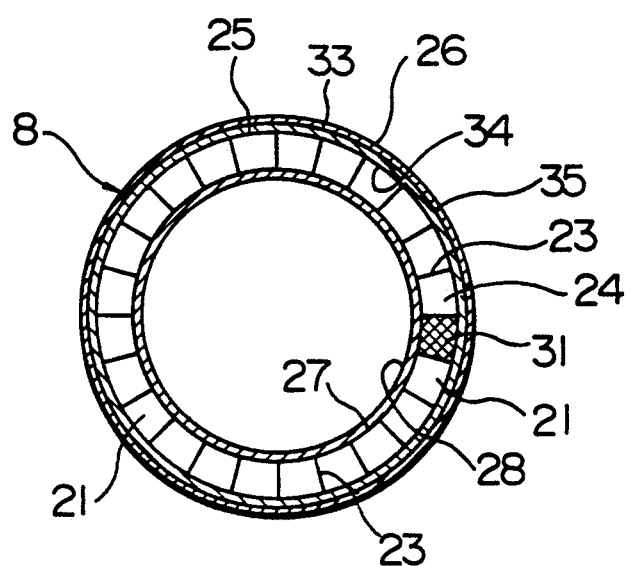
FIG. 5 is a sectional view taken along the line V—V of FIG. 4.

A sound absorption material 31 is filled in each of the through-holes 21 in the body portion 24 (In FIG. 5, such a sound absorption material 31 is filled only in one through hole 21 for illustration purposes). If a sufficient sound insulation can be achieved without the sound absorption materials 31, the provision of the sound absorption materials 31 may be omitted partially or totally.

Each of the outer peripheral portion 26 and the inner peripheral portion 28 is fixed to the body portion 24 by an adhesive.

The inner peripheral portion 28 is made of a sheet of carbon fiber-reinforced plastics which is bent into a cylindrical shape and is fixed to the inner peripheral surface 27 of the body portion 24 by the adhesive after bending the sheet-like member over the inner periphery 27 of the body portion 24 into the tubular form. The material for the inner peripheral portion 28 is not limited to carbon fiber-reinforced plastics, but preferably the inner peripheral portion 28 is made of at least one material selected from the group consisting essentially of non-magnetic metal, fiber-reinforced plastics, engineering plastics, a liquid crystal polymer, ceramics and paper. The fiber of the fiber-reinforced plastics is preferred to be a material selected from the group consisting of an aramid fiber, an aluminum fiber, a glass fiber, an alumina silica fiber, a carbon fiber, a potassium titanate whisker and a zinc oxide whisker.

The outer peripheral portion 26 comprises an inner tubular part 34 made of a sheet of non-magnetic stainless steel having a thickness of 0.5 to 1 mm (for example, 0.5 mm-thick SUS316), an outer tubular part 33 made of the similar or same sheet, and an intermediate layer 35 interposed between the inner and outer tubular parts 34 and 33, the intermediate layer 35 being made of a film of a viscoelastic material having a thickness of about 20 $\mu$m to about 100 $\mu$m. The inner and outer tubules 34 and 33 and the intermediate layer 35 are integrally joined together by an adhesive, so that the outer peripheral portion 26 has a so-called constrained damping (vibration suppressing) structure. The sheet-like outer peripheral portion 26 of a constrained damping structure having the three layers is fixedly secured to the outer periphery 25 of the body portion 24 by the adhesive after bending the sheet-like member of the three layer structure over the outer periphery 25 into the tubular form.

The materials for the inner and outer tubes 34 and 33 of the outer peripheral portion 26 are not limited to non-magnetic stainless steel, but the inner and outer tubes 34 and 33, like the inner peripheral portion 28, is preferred to be made of at least one material selected from the group consisting essentially of non-magnetic metal, fiber-reinforced plastics, engineering plastics, a liquid crystal polymer, ceramics and paper. The fiber of the fiber-reinforced plastics is preferred to be made of a material selected from the group consisting essentially of an aramid fiber, an aluminum fiber, a glass fiber, an alumina silica fiber, a carbon fiber, a potassium titanate whisker and a zinc oxide whisker.

In this embodiment, the outer peripheral portion 26 and the inner peripheral portion 28 are made of different materials, respectively, so that the body portion 24 has a predetermined mechanical strength, predetermined vibration-damping properties, and etc. However, in some cases, the outer and inner peripheral portions 26 and 28 may be made of the same material or may have the same structure. More specifically, instead of having a constrained damping structure, the outer peripheral portion 26 may be made of a single sheet, like the inner peripheral portion 28. Also, instead of being made of the single sheet, the inner peripheral portion 28 may have a constrained damping structure like the outer peripheral portion 26. Also, the intermediate layer of a constrained damping structure may be made of other suitable material than the viscoelastic material. In the case of the constrained damping structure, at least one of the outer and inner peripheral portions may be composed of more than two tubes, instead of being composed of the two tubes (33 and 34 in this embodiment).

In this embodiment, the outer peripheral portion 26 (more specifically, the outer tube 33) is made of the metallic sheet, and therefore the frequency of the sound produced by the striking against the coil bobbin 8 is shifted to a higher level by a magnitude of 500 Hz or more, as compared with the case where the outer peripheral portion is made of glass fiber-reinforced plastics. As a result, it is thought that because of the constrained damping effect achieved effectively in the higher frequency range by the constrained damping structure the noise level can be reduced by about 15 to 20 dB.

In a case where at least one of the outer and inner peripheral portions 26 and 28 is made of the metallic sheet, the thickness of the metallic sheet is limited to a suitable range, depending on the gradients at the leading and trailing edges of the gradient magnetic field-generating current pulse as well as on the magnitude of the specific resistance or resistivity of the metallic sheet, thereby eliminating a possibility that the gradient magnetic field is disturbed substantially by eddy currents flown through the metallic sheet. For example, when the current pulse having the gradient of about 20 to 100 A/ms at its leading and trailing edges is to be supplied for producing the gradient magnetic field, it has been found through a computer simulation test that stainless steel with a specific resistance of 72 mΩ·cm may be as thick as about 1 mm. In order to avoid the influence by the eddy current, the path of the eddy current in the metal sheet may be substantially cut or divided. To achieve this electrically discontinuous structure, the metallic sheet may be made of separate sheet elements joined together as shown partially at the left hand side part of FIG. 4 by imaging lines 41. Alternatively, grooves 4 may be formed in the surface of the metallic sheet so as to divide the metallic sheet into a virtually discontinuous parts as shown partially at the right and side part of FIG. 4 by imaging lines, thereby increasing the resistance at those groove portions. In this case, the average thickness of the metallic sheet may be increased.

In this embodiment, since the inner peripheral portion 28 is made of electrically-conductive carbon fiber-reinforced plastics having a specific resistance of about 20 mΩ·cm, it is also necessary to restrain the generation of the eddy current in the inner peripheral portion 28. However, since the carbon fiber-reinforced plastics is about ten times higher in mechanical strength than glass fiber-reinforced plastics, the thickness of the inner peripheral portion 28 can be reduced, and therefore the influence of the eddy current can be made practically negligible.

Figure 8:
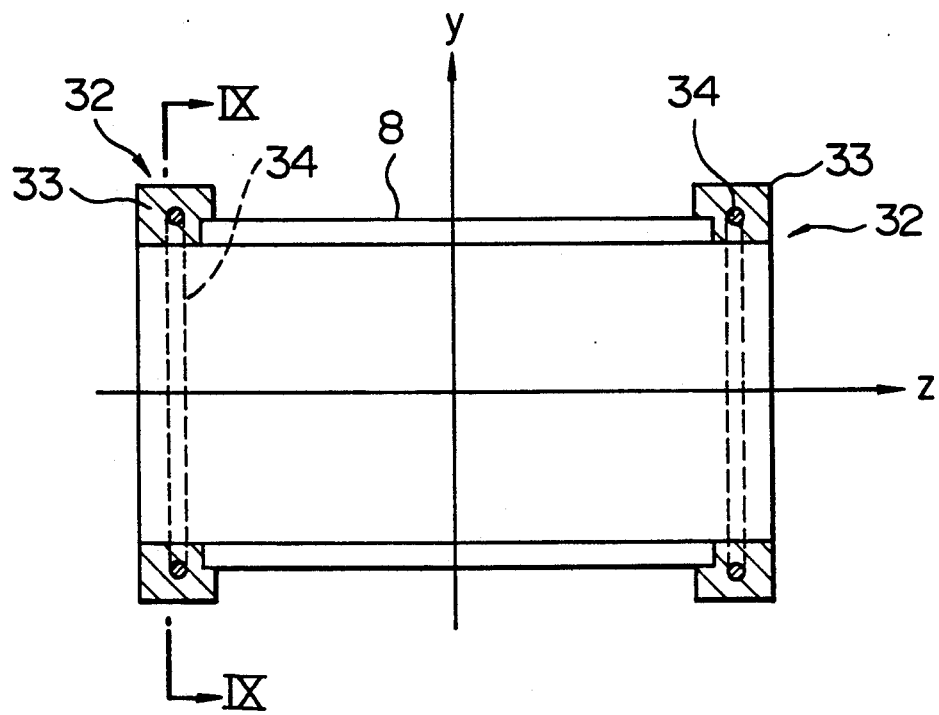
FIG. 8 is a sectional view of a coil bobbin of a modified gradient magnetic field coil of present invention.
Figure 9:
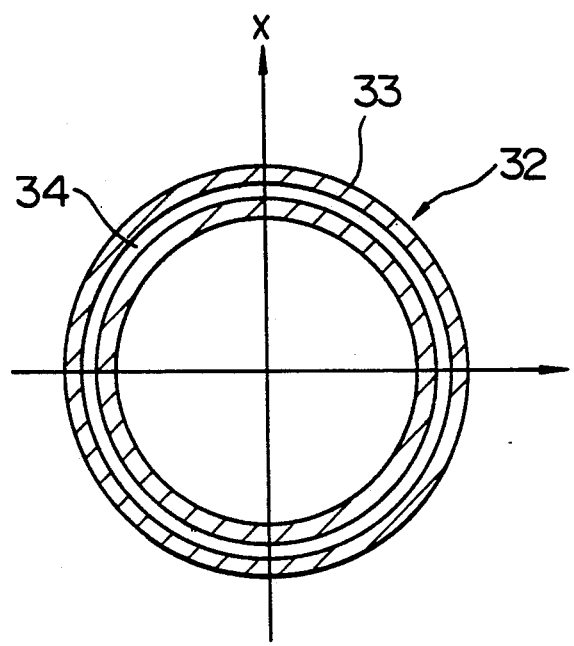
FIG. 9 is a sectional view taken along the line IX—IX of FIG. 8.
Figure 10:
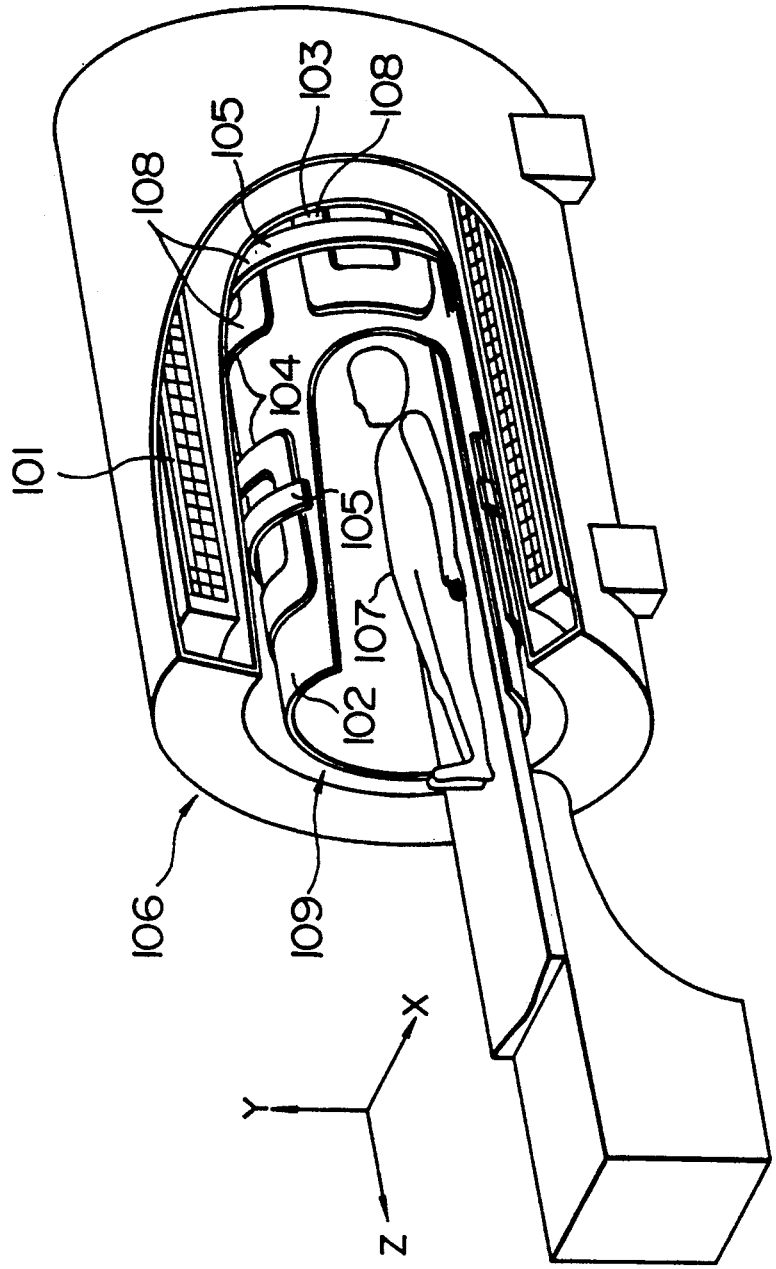
FIG. 10 is a perspective view of a magnet portion of a conventional magnetic resonance imaging system.
Figure 11A:
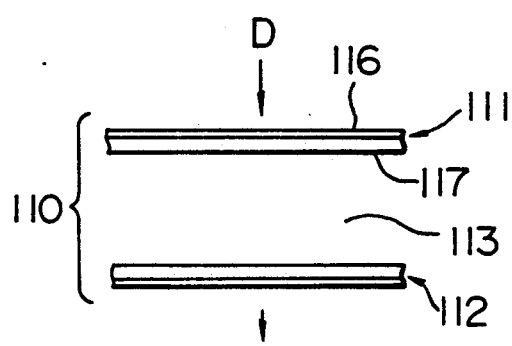
FIGS. 11A and 11B are side views respectively showing structures for enhancing the transmission loss of sound waves.
Figure 11B:
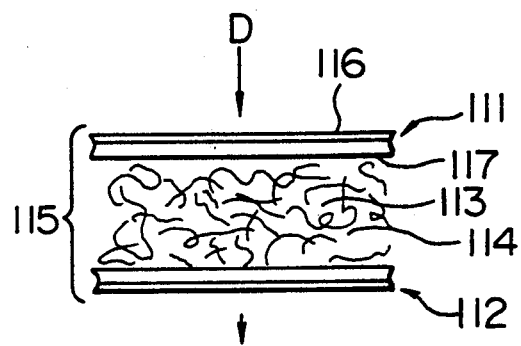
Figure 12:
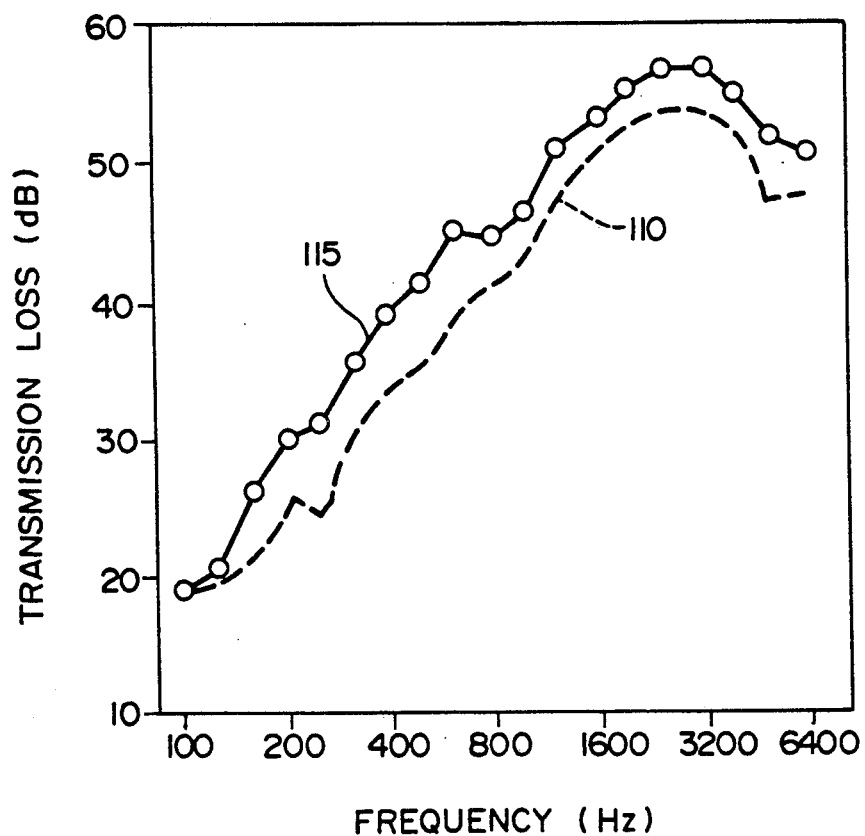
FIG. 12 is a graph showing the dependence of the transmission loss on the frequency in case of the structures of FIGS. 11A and 11B.

Both end portions of the coil bobbin 8 are reinforced by annular members 32, respectively, as shown in FIGS. 8 and 9. The annular member 32 comprises an annular main body 33 of a non-magnetic insulating material such as a reinforcement ring of glass fiber-reinforced plastics, and a metallic ring 34 embedded in the body 33 to increase the mechanical strength of the main body 33. The metallic ring 34 is made, for example, of SUS316 stainless steel. The annular members 32 not only increase the mechanical strength of the coil bobbin 8, but also serve to change the mode of vibration, of the coil bobbin 8, such as its proper vibration.

What is claimed is:

1. A gradient magnetic field coil for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a substantially rigid tubular main body portion having means for delimiting a plurality of openings in said tubular main body portion for suppressing noise, material constituting said tubular main body portion extending continuously in both axial and circumferential directions thereof; (ii) a continuous sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on an outer surface of said sheet-like outer peripheral portion of said coil bobbin so as to be mechanically supported therethrough by said tubular main body portion of said coil bobbin for producing an intermittent gradient magnetic field.

2. A gradient magnetic field coil according to claim 1, in which said means for delimiting openings delimits openings in said tubular main body portion having a polygonal sectional shape.

3. A gradient magnetic field coil, for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise, (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on said coil bobbin so as to be mechanically supported by said coil bobbin for producing an intermittent gradient magnetic field;
   in which said means for delimiting openings includes corrugated walls separating said openings from one another.

4. A gradient magnetic field coil, for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on said coil bobbin so as to be mechanically supported by said coil bobbin for producing an intermittent gradient magnetic field;
   in which a second absorption material is disposed in at least one of said openings in said tubular main body portion.

5. A gradient magnetic field coil for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and (b) coil windings fixedly mounted on said coil bobbin so as to be mechanically supported by said coil bobbin for producing an intermittent gradient magnetic field;

in which said tubular main body portion is made of at least one material selected from the group consisting essentially of non-magnetic metal, fiber-reinforced plastics, engineering plastics, a liquid crystal polymer, ceramics and paper, the fiber of said fiber-reinforced plastics being made of a material selected from the group consisting essentially of a glass fiber, a carbon fiber and an aramid fiber.

6. A gradient magnetic field coil according to claim 1, in which each of said outer peripheral portion and said inner peripheral portion is fixedly secured to said tubular main body portion by an adhesive.

7. A gradient magnetic field coil according to claim 1, in which at least one of said outer peripheral portion and said inner peripheral portion is made of at least one material selected from the group consisting essentially of non-magnetic metal, fiber-reinforced plastics, engineering plastics, a liquid crystal polymer, ceramics and paper, the fiber of the fiber-reinforced plastics being made of a material selected from the group consisting essentially of an aramid fiber, an aluminum fiber, a glass fiber, an alumina silica fiber, a carbon fiber, a potassium titanate whisker and a zinc oxide whisker.

8. A gradient magnetic field coil for use in a magnetic resonance imaging system for imaging a virtual cross-section of a desired portion of a subject to be inspected utilizing a magnetic resonance phenomenon, said gradient magnetic field coil comprising:

(a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and (b) coil windings fixedly mounted on said coil bobbin so as to be mechanically supported by said coil bobbin for producing an intermittent gradient magnetic field;

in which at least one of said outer peripheral portion and said inner peripheral portion is made of a non-magnetic stainless steel sheet with a thickness of not more than 1.0 mm.

9. A gradient magnetic field coil for use in a magnetic resonance imaging system for imaging a virtual cross-section of a desired portion of a subject to be inspected utilizing a magnetic resonance phenomenon, said gradient magnetic field coil comprising:

(a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and (b) coil windings fixedly mounted on said coil bobbin so as to be mechanically supported by said coil bobbin for producing an intermittent gradient magnetic field;

in which said outer peripheral portion and said inner peripheral portion are made of different materials from each other.

10. A gradient magnetic field coil for use in a magnetic resonance imaging system for imaging a virtual cross-section of a desired portion of a subject to be inspected utilizing a magnetic resonance phenomenon, said gradient magnetic field coil comprising:

(a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and (b) coil windings fixedly mounted on said coil bobbin so as to be mechanically supported by said coil bobbin for producing an intermittent gradient magnetic field;

in which at least one of said outer peripheral portion and said inner peripheral portion has a constrained damping structure.

11. A gradient magnetic field coil according to claim 10, in which said constrained damping structure is constituted by at least two layers of sheets, and a viscoelastic film interposed between said two layers.

12. A gradient magnetic field coil for use in a magnetic resonance imaging system for imaging a virtual cross-section of a desired portion of a subject to be inspected utilizing a magnetic resonance phenomenon, said gradient magnetic field coil comprising:

(a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and (b) coil windings fixedly mounted on said coil bobbin so as to be mechanically supported by said coil bobbin for producing an intermittent gradient magnetic field;

in which at least one of said outer peripheral portion and said inner peripheral portion comprises at least one layer of an electrically discontinuous nonmagnetic metallic sheet.

13. A gradient magnetic field coil for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise; (ii) a sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on said coil bobbin so as to be mechanically supported by said coil bobbin for producing an intermittent gradient magnetic field;
   in which a ring of non-magnetic metal is mounted in at least one end of said coil bobbin to reinforce said coil bobbin.

14. A gradient magnetic field coil for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise; (ii) a continuous sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on said coil bobbin so as to be mechanically supported by said coil bobbin for producing an intermittent gradient magnetic field;
   wherein said means for delimiting a plurality of openings delimits openings extending substantially in a radial direction of said tubular main body portion.

15. A gradient magnetic field coil for use in a magnetic resonance imaging system for imaging a virtual cross-section of a desired portion of a subject to be inspected utilizing a magnetic resonance phenomenon, said gradient magnetic field coil comprising:
   (a) a coil bobbin including (i) a tubular main body portion having means for delimiting a plurality of openings in said tubular main body portion for suppressing noise; (ii) a continuous sheet-like outer peripheral portion having at least one layer and fixedly secured to an outer peripheral surface of said tubular main body portion to reinforce said tubular main body portion; and (iii) a sheet-like inner peripheral portion having at least one layer and fixedly secured to an inner peripheral surface of said tubular main body portion to reinforce said tubular main body portion; and
   (b) coil windings fixedly mounted on said coil bobbin so as to be mechanically supported by said coil bobbin for producing an intermittent gradient magnetic field;
   wherein said means for delimiting a plurality of openings in said tubular main body portion provides a honeycomb construction for said tubular main body portion.

* * * * *